United States Patent [19]

Mehrad

[11] Patent Number: 5,576,992
[45] Date of Patent: Nov. 19, 1996

[54] EXTENDED-LIFE METHOD FOR SOFT-PROGRAMMING FLOATING-GATE MEMORY CELLS

[75] Inventor: Freidoon Mehrad, Plano, Tex.

[73] Assignee: Texas Instruments Incorporated, Dallas, Tex.

[21] Appl. No.: 521,555

[22] Filed: Aug. 30, 1995

[51] Int. Cl.$^6$ ................................................. G11C 16/00
[52] U.S. Cl. .............................. 365/185.24; 365/185.28; 365/185.33; 365/185.3
[58] Field of Search ...................... 365/185.24, 185.18, 365/185.28, 185.29, 185.3, 185.33

[56] References Cited

U.S. PATENT DOCUMENTS

| | | | |
|---|---|---|---|
| 5,272,669 | 12/1993 | Samachisa et al. | 365/185.3 |
| 5,400,286 | 3/1995 | Chu et al. | 365/185.3 |
| 5,467,306 | 11/1995 | Kaya et al. | 365/185.24 |

Primary Examiner—Tan T. Nguyen
Attorney, Agent, or Firm—Theodore D. Lindgren; Leo N. Heiting; Richard L. Donaldson

[57] ABSTRACT

An extended-life method for soft-programming at least one floating gate memory cell (10) includes connecting the substrate and the source (11) to a reference voltage, then applying to the control gate (13) a soft-programming voltage, the soft-programming voltage being between thirty and sixty percent of the voltage used to hard-program the cell. Increasing voltages are applied to the drain (12), while measuring the current flow into the drain (12). A specific drain (12) voltage, less than or equal to that value of drain (12) voltage at which the current flow into the drain (12) reaches a first peak, is chosen. With the substrate at reference voltage, the cell (10) is soft-programmed by applying to the drain (12) a first voltage slightly less than or equal to the specific drain (12) voltage; by applying to the source (11) a non-negative second voltage less than the specific drain (12) voltage; and by applying to the control gate (13) a third voltage no greater than the soft-programming voltage.

12 Claims, 4 Drawing Sheets

EXTENDED-LIFE METHOD FOR SOFT-PROGRAMMING FLOATING-GATE MEMORY CELLS

BACKGROUND OF THE INVENTION

The present invention relates to a nonvolatile, integrated-circuit memory array such as an electrically-erasable, electrically-programmable read-only-memory (EEPROM) array. In particular, the invention relates to a method for soft-programming floating-gate memory cells of those arrays.

EEPROMs using hot-carrier-injection programming, as opposed to Fowler-Nordheim tunneling programming, are described in: (a) "A Single Transistor EEPROM cell and its implementation in a 512 K CMOS EEPROM", S. Mukherjee et al., IEDM 1985 (p. 616–619) and in (b) "A 90ns 100 K Erase/Program Cycle Megabit Flash Memory", V. Kynett et al., ISSCC 1989 (p. 140–141). The topic of reference (a) is also discussed in U.S. Pat. No. 4,698,787.

When using conventional prior-an, hot-carrier-injection methods for "hard" programming; a reference voltage equal to the substrate voltage ($V_{SUB}$, which is perhaps 0 V) is applied to the source of the cell to be programmed; a first positive voltage $V_{DD}$, perhaps 6 V to 8 V, is applied to the drain; and a second positive voltage $V_{P1}$, perhaps 12 V, is applied to the control gate. Under these conditions, the channel between source and drain is highly conductive, the junction between the drain diffusion and the substrate (channel) is reverse-biased, but the junction between the source diffusion and the substrate is not reverse-biased. Electrons reaching the drain diffusion are subjected to two electric fields, one associated with the reverse-biased drain diffusion junction and the other associated with the positive voltage coupled from the control gate to the floating gate. The electric fields cause electrons (hot carriers) to be injected into the floating gate.

When using conventional methods to erase flash EEPROMs, the drain-column lines are floated (connected to a high impedance), the wordlines are connected to a reference potential, and the source lines are connected to a high positive voltage (approx. +10 V to +15 V). Under these conditions the electric field across the gate oxide region generates a Fowler-Nordheim tunnel current that transfers charge from the floating gate to the source, erasing each memory cell.

One problem associated with prior-art flash EEPROMs has been a wide distribution of threshold voltages after a flash erase operation. The wide distribution is believed to be caused, at least in part, by trapped holes in the gate insulator or by injection of hot holes into the floating gate. Another problem arising in flash EEPROMs is over-erasure of cells. An over-erased cell has a positive charge, causing the channel under the floating gate to be conductive. That over-erased conductive cell short-circuits other cells in its column of parallel-connected cells. One method of compensating for over-erasure is to form the flash EEPROM cells using split gates. Other methods include applying alternating programming and erasing steps as described, for example, in U.S. Pat. No. 5,132,935 issued Jul. 21, 1992, in U.S. Pat. No. 5,122,985 issued Aug. 16, 1992, and references cited in those patents. Both patents relate to compaction, or narrowing, of the threshold voltage distributions of flash erased cells and both patents are assigned to Texas Instruments Incorporated.

It is desirable to have a narrow distribution of positive threshold voltages after performing a flash-erase procedure. In order to obtain the narrow distribution of erased threshold voltages, one flash erase method requires a complete flash-programming step before the actual erase step is performed. Another method requires that light erasing pulses be applied in steps after programming all of the EEPROM cells, checking after each step to see whether or not all of the cells are erased. Yet another method requires that a "soft" flash program step be performed after the erase step to arrive at a final narrow distribution of erased threshold voltages.

Several methods are proposed to narrow or "compact" the distribution of programmed threshold voltages. One of those methods uses wordline stress to cause Fowler-Nordheim injection of electrons into the floating gate. That method is described in "A Novel Erasing Technology for 3.3 V Flash Memory with 64 Mb Capacity and Beyond", Oyama et al., IEDM 1992, (pp. 24.5.1–24.5.4). There is no limit on the magnitude of bitline leakage current using that method. However, the method requires gate voltages higher than the normal programming voltage. Those higher gate voltages require, in turn, special fabrication steps that either lower the electric fields in the dielectric elements or strengthen those dielectric elements.

A second proposed method relies on hot-electron injection into the gate. This method is described in "A Self-Convergence Erasing Scheme for a Simple Stacked Gate Flash EEPROM", Yamada, et al., IEDM 1991 (pp. 11.4.1–11.1.4). In the second method, the bitlines are biased at a voltage of 6–7 V and the sources are grounded (substrate voltage, or 0 V) while a low voltage (0–2 V) is applied to the control gates. Using this second method, hot holes may be injected into the gate, thus increasing the drain-column-line leakage and defeating the purpose of the compaction.

Recently, methods have been proposed for programming EPROMs using channel-hot electrons with sources biased at a positive voltage with respect to the substrate. Three variations of these methods are described in U.S. Pat. No. 5,218,571 issued Jun. 8, 1993; U.S. Pat. No. 5,295,095 issued Mar. 15, 1994 and U.S. Pat. No. 5,258,949 issued Nov. 2, 1993. In addition, a method for programming EPROMs to increase compaction gate-current efficiency by reverse biasing the source-substrate junctions of the cell or cells being programmed is described in U.S. patent application Ser. No. 08/085,427 filed Oct. 4, 1993 now U.S. Pat. No. 5,467,306 and also assigned to Texas Instruments Incorporated. In that Application, the reverse biasing condition limits the channel currents of individual cells being programmed and of the entire array during a flash-programming compaction step. The control-gate voltages described in that patent application are very low. Because the control-gate voltages are low, the channel currents are low. Therefore, hot-hole injection is essentially eliminated. Minimizing damage to the oxide gate insulators results in an increase in the number of write-erase cycles before cell damage occurs and, therefore, results in an increase in the life of the memory array. However, the time required for the programming operation described in that patent application is relatively long.

While the prior-art includes programming operations for recovering the over-erased cells from depletion and, at the same time, tightening the threshold-voltage distribution without damaging the oxide gate insulators of those cells, the prior-art does not include a method for accomplishing all of those tasks in a manner that permits rapid completion of the programming operation. A rapid programming operation increases the usage efficiency of the memory array in those applications that require numerous read and erase operations.

SUMMARY OF THE INVENTION

When used to flash program an array of memory cells, the programming method of this invention rapidly achieves a relatively narrow distribution of positive threshold voltages with minimal gate-insulator degradation.

The method herein allows use of a control-gate voltage that is high enough to shorten the time required to perform the programming operation. At the same time, source and drain voltages are chosen to limit the substrate current. Because substrate current is a direct measure of hot-hole creation, limiting the substrate current decreases gate-insulator degradation due to hot holes. Minimizing the gate-insulator degradation results in the capability of performing a higher number of write-erase cycles during the life of the device. The compaction method is self-limiting. There is no shift in the primary threshold voltage population during compaction of an entire memory array or of a sector of a memory array.

The extended-life method for soft-programming of one or more floating-gate memory cells includes connecting the substrate and the source to a reference voltage, then applying a soft-programming voltage to the control gate, the soft-programming voltage being between thirty and sixty percent of the voltage used to hard-program the cell. Increasing voltages are applied to the drain while measuring the current flow into the drain. A specific drain voltage, less than or equal to that value of increasing drain voltage at which the current flow into the drain reaches a first peak, is chosen. With the substrate at reference voltage, the cell is soft-programmed by applying to the drain a first voltage slightly less than, or no greater than, the specific drain voltage; by applying to the source a non-negative second voltage less than the specific drain voltage; and by applying to the control gate a third voltage no greater than the soft-programming voltage.

DETAILED DESCRIPTION OF THE INVENTION

Figure 1:
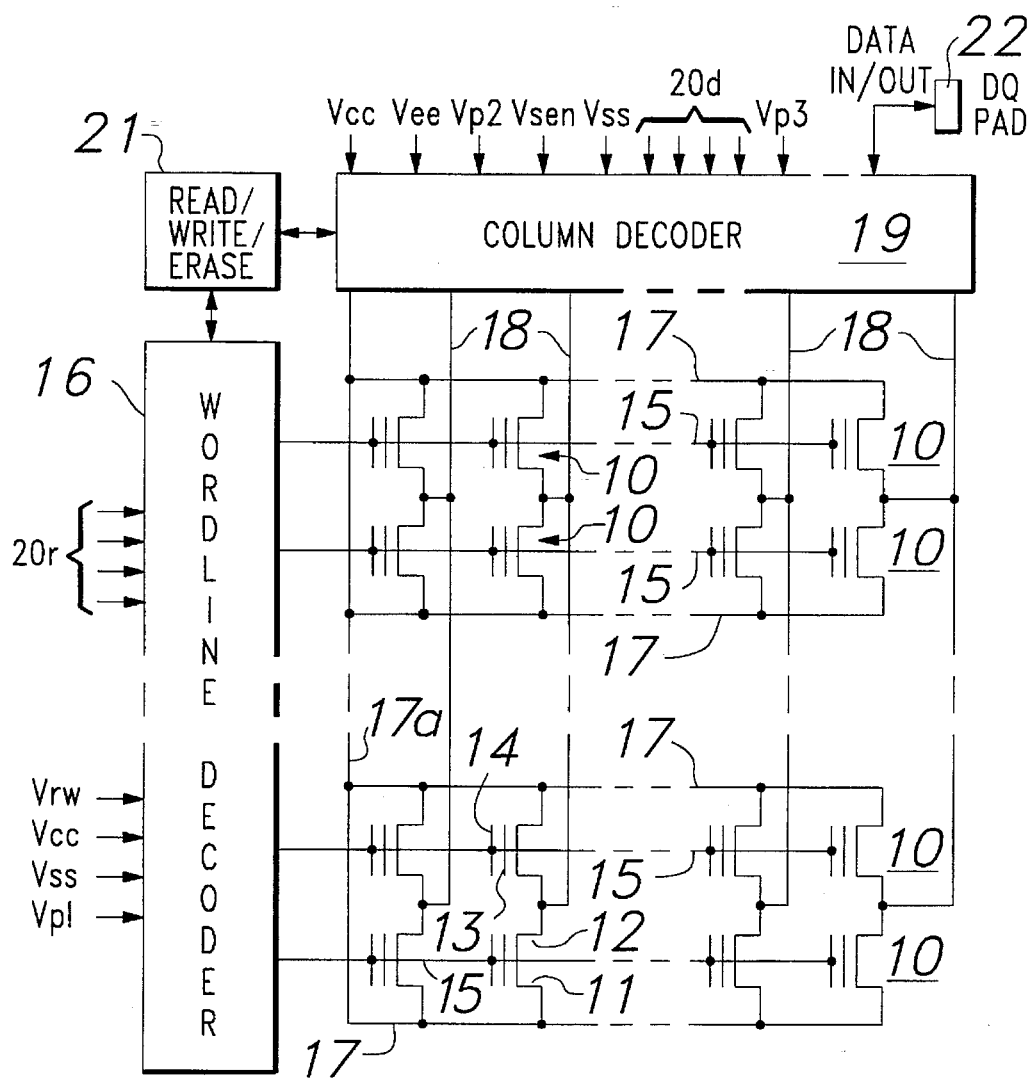
FIG. 1 is an electrical schematic diagram, in partial block form, of a memory cell array.

Referring to FIG. 1, an example array of memory cells, which is an integral part of a memory chip, is shown for the purpose of illustrating use of the method of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In the read mode, the wordline decoder 16 functions, in response to wordline address signals on lines 20r and to signals from Read/Write/Erase control circuit 21 (or microprocessor 21), to apply a preselected positive voltage $V_{CC}$ (approx. +5 V) to the selected wordline 15, and to apply a low voltage (ground or $V_{SUB}$) to deselected wordlines 15. The column decoder 19 functions to apply a preselected positive voltage $V_{SEN}$ (approx. +1 V) to at least the selected drain-column line 18 and to apply a low voltage (0 V) to the source line 17. The column decoder 19 also functions, in response to signal on address lines 20d, to connect the selected drain-column line 18 of the selected cell 10 to the DATA IN/OUT terminal. The conductive or nonconductive state of the cell 10 connected to the selected drain-column line 18 and the selected wordline 15 is detected by a sense amplifier (not shown) connected to the DATA IN/OUT terminal 22.

During a flash-erase mode, the column decoder 19 may function to leave all drain-column lines 18 floating (connected to a high impedance such as field-effect transistor biased in "OFF" condition). The wordline decoder 16 functions to connect all the wordlines 15 to reference potential $V_{SUB}$, which may be ground. The column decoder 19 also functions to apply a high positive voltage $V_{EE}$ (approx. +10 V to +15 V) to all the source lines 17. These erasing voltages create sufficient field strength across the gate oxide region to generate a Fowler-Nordheim tunnel current that transfers charge from the floating gate 13, erasing the memory cell 10. Since the potential on the wordline 15 is 0 V, the cell 10 remains in the nonconducting state during erase. For that reason, and also by reason of the fact that the drain 12 is floated, no channel-hot carriers are generated.

In a prior-art write or program mode, the wordline decoder 16 may function, in response to wordline address signals on lines r and to signals from Read/Write/Erase control circuit 21, (or microprocessor 21 ) to place a preselected first programming voltage $V_{P1}$ (approx. +12 V) on a selected wordline 15, including a selected control-gate 14. Column decoder 19 also functions to place a second programming voltage $V_{P2}$ (approx. +5 to +10 V) on a selected drain-column line 18 and, therefore, the drain 12 of selected cell 10. In the prior-art method, source lines 17 are connected to reference potential $V_{SUB}$, which may be ground. All of the deselected drain-column lines 18 are connected to reference potential $V_{SUB}$ or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region (with $V_{P1}$ at 0 V). For memory cells 10 fabricated in accordance with the example embodiment, the coupling coefficient between a control gate 14/wordline 15 and a floating gate 13 is approximately 0.6. Therefore, a prior-art programming voltage $V_{P1}$ of 12 V, for example, on a selected wordline 15, including the selected control gate 14, places a voltage of approximately +7.2 V on the selected floating gate 13. The voltage difference between the floating gate 13 (at approx. +7.2 V) and the grounded (approx. 0v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive with a positive read voltage on control gate 14, a state which is read as a "zero" bit. Deselected cells 10 have source-drain paths under the floating gate 13 that remain conductive, and those cells 10 are read as "one" bits.

In the flash-program compaction mode (which may follow a prior-art flash erase cycle), according to this invention, the wordline decoder 16 may function, in response to wordline address signals on lines r and to signals from Read/Write/Erase control circuit 21, (or microprocessor 21 ) to place a preselected first programming voltage $V_{P1}$ (approx. +1 V to 4 V) on all of the wordlines 15. Column decoder 19 also functions to place a second programming voltage $V_{P2}$, (approx. +6 V to +7 V) on all of drain-column lines 18. All of source lines 17 are raised to a third programming voltage $V_{P3}$ (approx. +1 V to +2 V). These programming voltages create a relatively low current (drain 12 to source 11) condition in the channel of the selected memory cell 10, resulting in the generation channel-hot electrons and avalanche-breakdown electrons that are injected across the channel oxide to the floating gate 13 of the cells 10. The programming time is selected to be sufficiently long to remove any positive charge from all of the floating gates 13 and to compact the threshold voltage Vt distribution. The length of time is on the order of one second, which is much longer than that of the prior-art method because of the very small charging currents. However, during that time, the whole array is programmed. The small programming voltage $V_{P1}$ does not, of course, cause a sufficient Fowler-Nordheim tunneling current across the gate oxide between source 11 and floating gate 13 to charge the floating gates 13 of cells 10. However, the floating gates 13 of cells 10 are charged slowly with hot electrons injected during programming.

The flash-program method of this invention is used to program all of the cells 10 prior to erase, or to program one cell or a row or column of cells, is similar to the compaction method described above except that the gate voltages of the programmed cells are ramped to a first programming voltage $V_{P1}$, of perhaps +10 V rather than the approximately +1 V to +4 V described above. Rather than simply removing any positive charge and/or compacting the voltage thresholds $V_T$, the floating gates are programmed with a negative program charge of approximately −2 V to −6 V with respect to the channel region. Again, the length of time required is much longer than that of the prior-art method because of the very small charging currents. However, overall chip programming times are comparable.

For convenience, a table of read, write and erase voltages is given in TABLE I below:

TABLE I

| | Read | Write | Flash Erase | Flash Program | Flash Program (Compaction) |
|---|---|---|---|---|---|
| Selected Wordline | 5V | 12V | 0V (All) | 10V (All) (ramped) | 1–4V (All) |
| Deselected Wordlines | 0V | 0V | — | — | — |
| Selected Drain Line | 1.0V | 5–10V | Float (All) | 5–10V (All) | 6–7V (All) |
| Deselected Drain Lines | 0V/Float | 0V/Float | — | — | — |
| Source Lines | 0V | 0V | 10–15V (All) | 1–2V (All) | 1–2V (All) |

Figure 2:
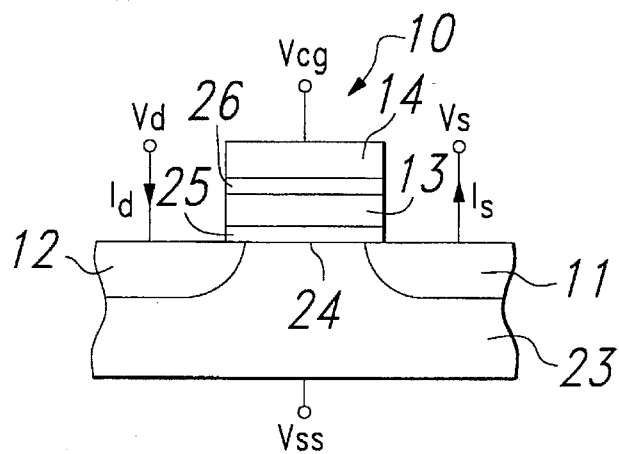
FIG. 2 is a cross-section of a typical floating-gate cell of the type used in the memory cell array of FIG. 1.

FIG. 2 is a cross-section of a typical floating-gate cell 10 of the type used in the memory cell array of FIG. 1. Source 11 and drain 12 are formed by impurity diffusion in a semiconductor substrate 23 having impurity of the opposite-type as the source 11 and drain 12 diffusions. The source 11 is typically formed by a diffusion of two types of impurities. The substrate 23 area between the source 11 and the drain 12 is the cell channel 24. The floating gate 13 is formed from a layer of polysilicon insulated from the channel 24 by gate insulator 25. The polysilicon control gate 14, which is a part of the wordline 15 of FIG. 1, is insulated from the floating gate 13 by and inter-level insulator 26.

This invention may best be explained by reference to data obtained from experiments on test structures for memory cells 10. The test structure has cells 10 with actual floating gates 13 and with control gates 14 insulated by inter-level insulator 26 from those floating gates 13. Programming is accomplished by applying voltages to probes connected to the control-gate 14 polysilicon, to the source 11 conductors, and to the drain 12 conductors.

Hot holes injected into the gate oxide 25 during programming and/or compaction are responsible for damage to the gate oxide 25. The damage to the gate oxide 25, in effect, reduces the number of write/erase cycles during the life of the memory cell 10.

To reduce the oxide 25 damage due to the hot-hole injection, a reduction of the number of hot holes created during programming and/or compaction is necessary. This task is achieved by lowering the programming voltage $V_{DS}$ applied to the drain from the prior-art 6 V–7 V volts to a voltage of about 4.1 V during compaction.

Experiments on a particular one-layer-polysilicon device show that a drain voltage $V_{DS}$ of 4.1 V:

1) causes minimum or no oxide damage during compaction, which is verified by:
   a) monitoring the substrate current $I_{SUB}$ during the compaction (the value of substrate current $I_{SUB}$ is a direct measure of how many hot holes are created) and
   b) measuring the subthreshold slope of the device before and after the compaction;
2) does a good and efficient compaction.

Figure 3:
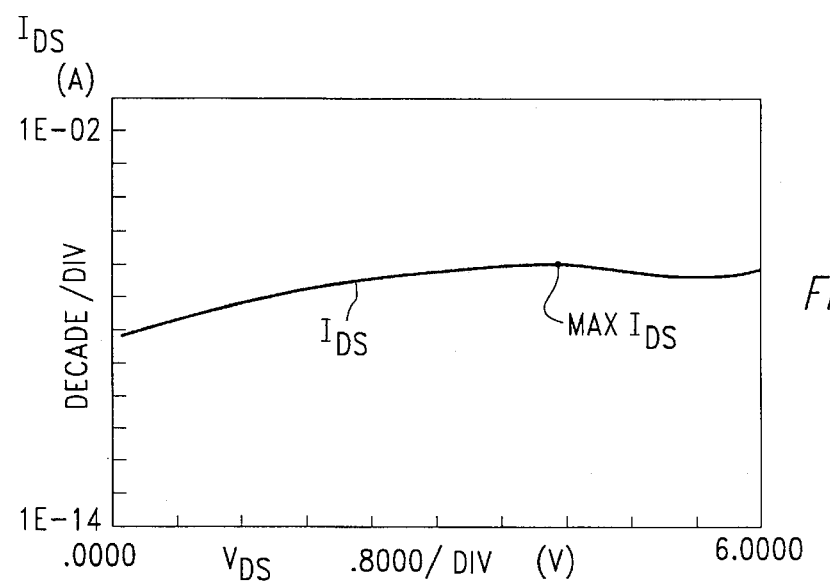
FIG. 3 illustrates variation of drain current as the drain-to-source voltage of a one-cell test structure varies, with about +5 V connected to the control gate and with the source grounded and substrate at 0 V.

FIG. 3 shows the drain-current/drain-voltage ($I_{DS}/V_{DS}$) curve for a single cell 10 formed with two levels of polysilicon with 5 V applied to the control gate 13, 0 V applied to the source and to the substrate, while the drain voltage $V_{DS}$ is ramped from 0 V to 6 V. The control gate voltage $V_{CG}$ is chosen to be 5 V because that value is low enough not to hard-program the cell (the control-gate voltage $V_{CG}$ for hard-programming is about 12 V) but is high enough to do the compaction efficiently (in shorter time). From the curve of FIG. 3, the drain voltage $V_S$ is chosen to be 4.1 V, the point on the curve that has the highest drain current $I_{DS}$, which is about 11 µA.

In FIG. 3 the source voltage $V_S$ is at 0 V with respect to the substrate voltage, which results in a drain current $I_{DS}$ of about 11 µA. But the drain current $I_{DS}$ may be reduced to a more desirable value by increasing the source voltage $V_S$. While a drain current $I_{DS}$ of 11 µA is easily supplied and the compaction time is only a few milliseconds for one cell, if more than one cell is to be compacted, a much large drain current $I_{DS}$ may be required. For example, if each of the cells in one column of 1024 cells draws the same 11 µA, then the total drain current required is more than about 11 mA. If this total drain current cannot be 30 supplied by the power supply $V_{DD}$, the source voltage $V_S$ must be increased to lower the required drain current $I_{DS}$ during compaction. The price paid for increasing the source voltage $V_S$ and lowering the drain current $I_D$ is an increase in the compaction time.

Figure 4:
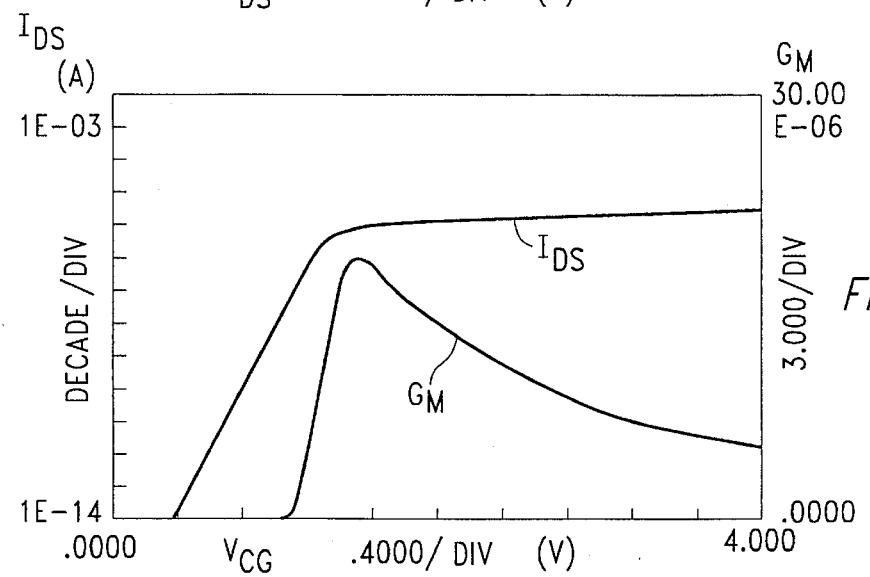
FIG. 4 shows the subthreshold slope of a device having one level of polysilicon before compaction with the above conditions.
Figure 5:
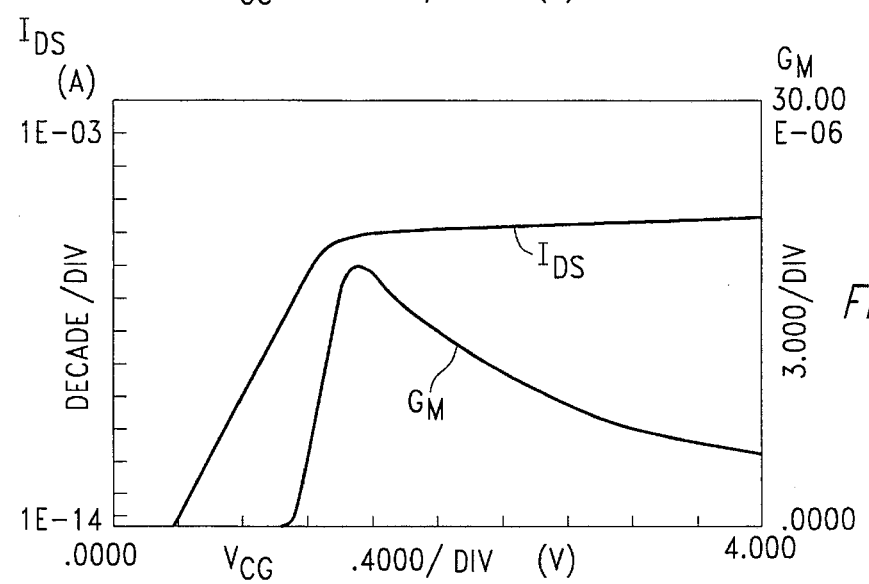
FIG. 5 shows the subthreshold slope of the same cell in FIG. 4 after compaction with a drain voltage $V_{DS}$ of 4.1 V, a floating gate voltage $V_{PG}$ of 3.3 V, a source voltage $V_S$ of 1.5 V and substrate voltage $V_{SUB}$ of 0 V for 100 seconds.

FIG. 4 shows the subthreshold slope of a device having one level of polysilicon before compaction with the above conditions. FIG. 5 shows the subthreshold slope of the same cell in FIG. 4 after compaction. The FIGS. illustrate a method for determining the threshold voltage $V_T$ in test structures before and after erasure. That method is to measure the drain current $I_{DS}$ and the transconductance $G_M$, as the control-gate voltage $V_{CG}$ varies from 0 V to +4 V. Note that the drain current $I_{DS}$ does not begin to flow until control-gate voltage $V_{CG}$ reaches about +0.4 V, indicating no over-erasure. The graph of transconductance $G_M$ in FIGS. 4 and 5 indicates change in drain current $I_{DS}$ divided by change in control-gate voltage $V_{CG}$. The control-gate voltage $V_{CG}$ at the peak of the $G_M$ curve corresponds to the threshold voltage $V_T$ of a typical cell 10.

The compaction conditions for the above one-level-polysilicon device are a drain voltage $V_{DS}$ of 4.1 V, a floating gate voltage $V_{PG}$ of 3.3 V (which is equivalent to control gate voltage $V_{CG}$ of 5.5 V, which is in the range of thirty to sixty percent of the hard-programming voltage of 12 V, on a floating-gate cell 10 having a capacitive coupling ratio of 0.6), a source voltage $V_S$ of 1.5 V and substrate voltage $V_{SUB}$ of 0 V for 100 seconds. As can be seen from FIGS. 4 and 5, there is almost no change in the subthreshold current before and after the compaction, which is an indication of no oxide damage.

Figure 6:
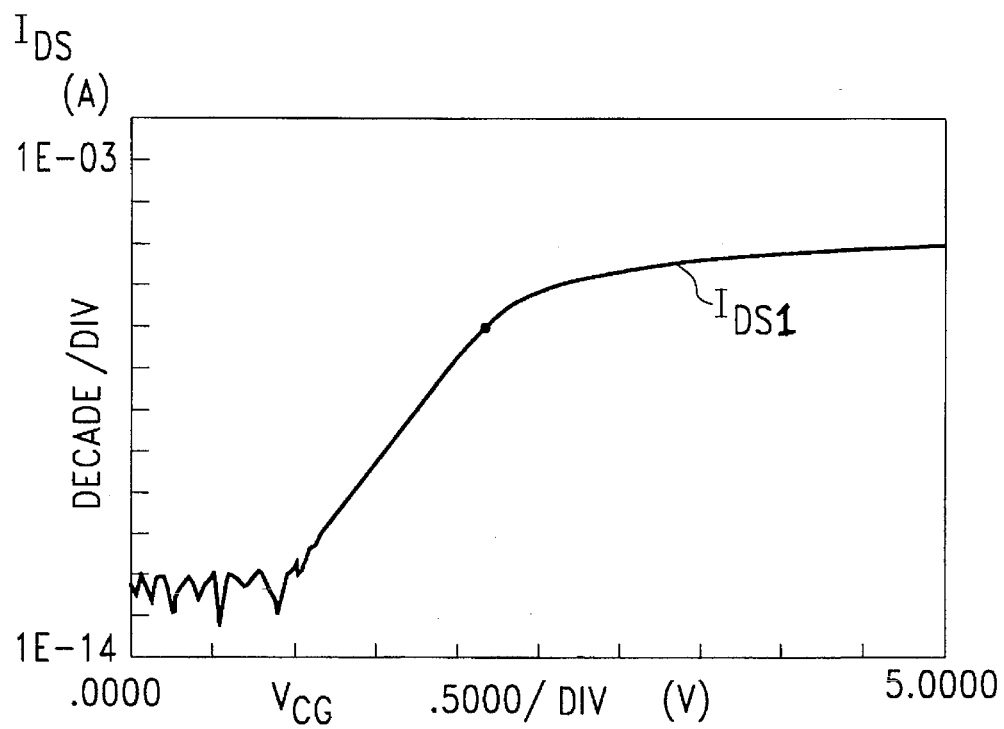
FIG. 6 shows the subthreshold slope curve ($I_{DS1}$) for a floating-gate cell having an ultraviolet threshold voltage $V_{TUV}$ of 2.17 V.
Figure 7:
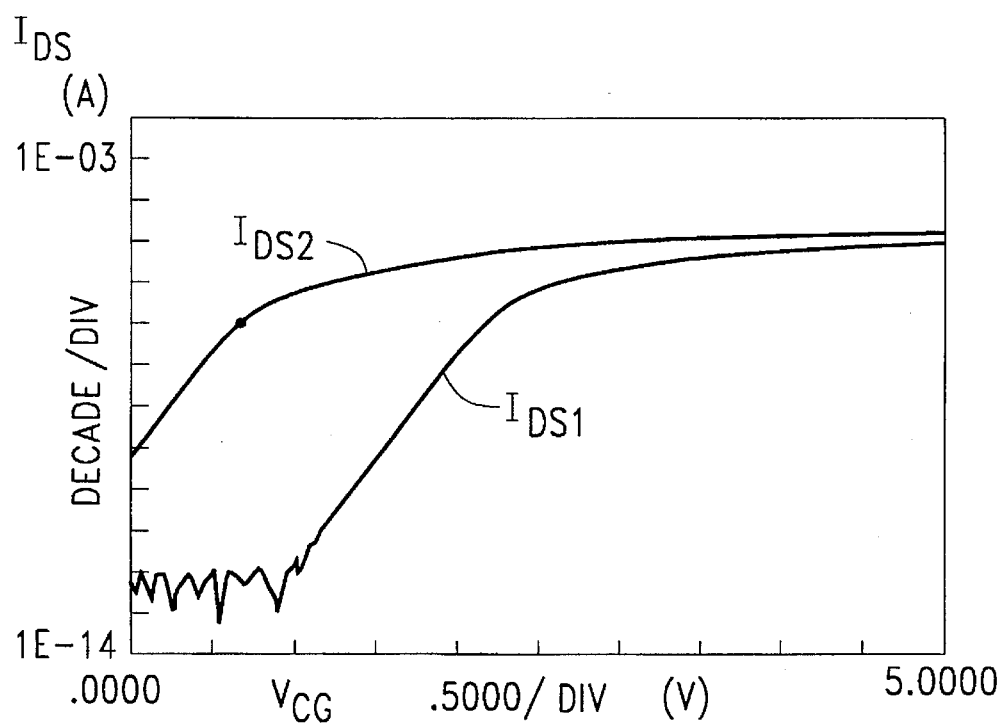
FIG. 7 shows the subthreshold slope curve ($I_{DS2}$) for the floating-gate cell of FIG. 6 after programming and erasure to a threshold voltage $V_T$ of 0.68 V with the subthreshold slope curve ($I_{DS1}$) curve of FIG. 6 shown for comparison.
Figure 8:
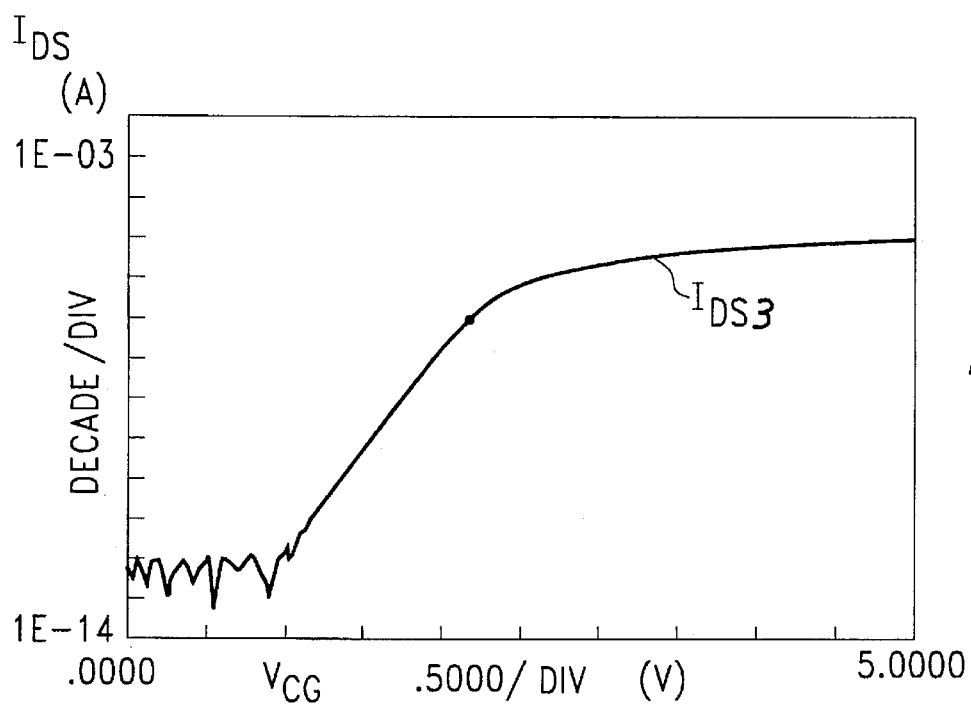
FIG. 8 shows the subthreshold slope curve ($I_{DS3}$) for the floating-gate cell of FIGS. 6 and 7 after compaction with a drain voltage $V_{DS}$ of 4.1 V, a control gate voltage $V_{CG}$ of 5.5 V, a source voltage $V_S$ of 1.5 V and a substrate voltage $V_{SUB}$ of 0 V for 10 milliseconds and shows that, after compaction, the threshold voltage $V_T$ is about 2.19 V, which is close to the ultra-violet threshold voltage $V_{TUV}$.

FIG. 6 shows the subthreshold current curve $I_{DS1}$ curve for a floating-gate cell 10 having an ultraviolet threshold voltage $V_{TUV}$ of 2.17 V. The floating-gate cell 10 in FIG. 6 is programmed, then erased to a threshold voltage $V_T$ of 0.68 V, and the new subthreshold current $I_{DS2}$ is depicted in FIG. 7. The cell of FIG. 7 is then compacted with a drain voltage $V_{DS}$ of 4.1 V, a control gate voltage $V_{CG}$ of 5.5 V, a source voltage $V_S$ of 1.5 V and a substrate voltage $V_{SUB}$ of 0 V for 10 milliseconds. The subthreshold current $I_{DS3}$ after compaction is shown in FIG. 8. The threshold voltage $V_T$ after compaction is measured to be 2.19 V, which is close to the ultra-violet threshold voltage $V_{TUV}$.

Figure 9:
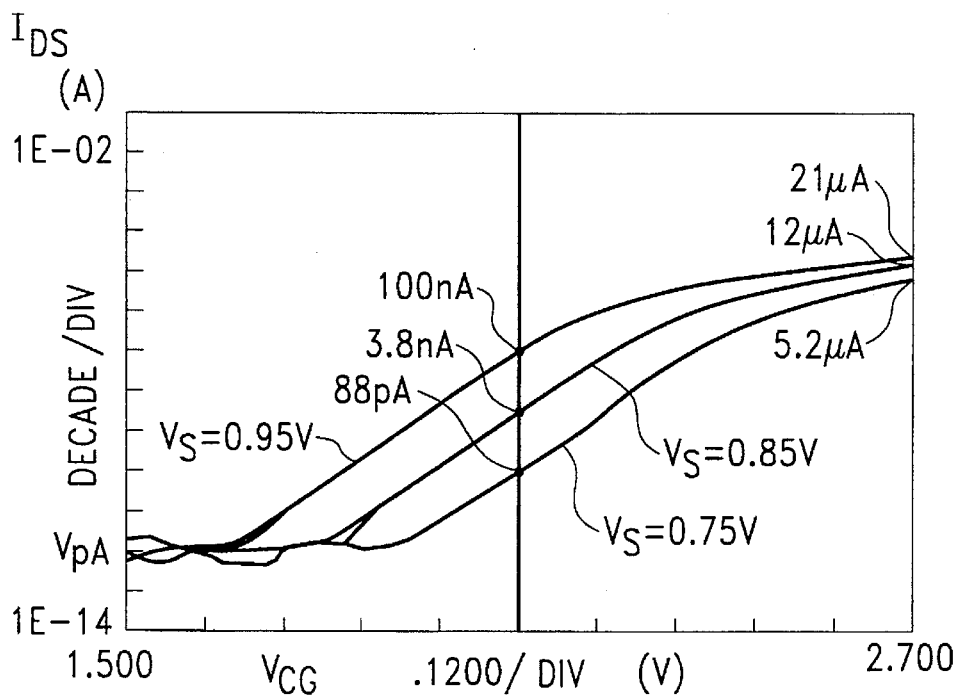
FIG. 9 shows drain currents $I_{DS}$ versus floating-gate voltage $V_{PG}$ for source voltages $V_S$ of 0.75 V, 0.85 V and 0.95 V and for a drain voltage $V_{DS}$ of 4.9 V for one-level polysilicon device, and illustrates choice of proper control-gate voltage $V_{CG}$, drain current $I_{DS}$ and source voltage $V_S$ for compacting a group of cells.

If there are limitations on voltages that can be applied to the chip, the biasing conditions during the compaction may be modified to accommodate for these limitations, as illustrated in FIG. 9 and in TABLE 2. FIG. 9 shows drain currents $I_{DS}$ versus floating-gate voltage $V_{PG}$ for source voltages $V_S$ of 0.75 V, 0.85 V and 0.95 V and for a drain voltage $V_{DS}$ of 4.9 V for one-level polysilicon device. FIG. 9 may be used as a guide for choosing proper control-gate voltage $V_{CG}$, drain current $I_{DS}$ and source voltage $V_S$ for compacting a group of cells. As is seen, the drain voltage $V_{DS}$ is increased to 4.9 V from 4.1 V to compensate for the lower voltage limitations on the control gate.

TABLE 2 shows the drain current $I_{DS}$ measurements on single-level polysilicon devices having a floating-gate voltage $V_{PG}$ of 1.5 V (this is equivalent to control gate voltage $V_{CG}$ of 2.5 V, an assumed maximum available voltage for application to the control gate 13, if the capacitive coupling ratio is 0.6) for different over-erased conditions with three different source voltages $V_S$. As is seen in TABLE 2, different values of drain current $I_{DS}$ are obtained for different over-erased conditions. For example, if the applied source voltage $V_S$ is 0.75 V and the cell 10 has been over-erased to have a threshold voltage $V_T$ of 0.0 V, 21 µA of the drain current $I_{DS}$ is required during the compaction of that cell 10. However, if it is required to compact one column of 1024 similarly over-erased cells 10, a total drain current of over 21 mA is needed. If the power supply is incapable of furnishing 21 mA of drain current $I_{DS}$, the source voltage $V_S$ may be increased to 0.95 V. That results in (as shown in TABLE 2) only 5 mA of total drain current $I_{DS}$ required to compact a whole column of 1024 similarly over-erased cells 10.

TABLE 2

| $V_{CG}$ | $V_{FG}$ | + over-erased f.g. voltage | $V_S$ | $I_{DS}$ |
|---|---|---|---|---|
| 2.5 | 1.5 | + 0.0 (Vt = 2.0) | 0.75 | 1 pA |
|  | 1.5 | + 0.6 (Vt = 1.0) | 0.75 | 100 nA |
|  | 1.5 | + 1.2 (Vt = 0.0) | 0.75 | 21 µA |
| 2.5 | 1.5 | + 0.0 (Vt = 2.0) | 0.85 | 1 pA |
|  | 1.5 | + 0.6 (Vt = 1.0) | 0.85 | 4 nA |
|  | 1.5 | + 1.2 (Vt = 0.0) | 0.85 | 12 µA |
| 2.5 | 1.5 | + 0.0 (Vt = 2.0) | 0.95 | 1 pA |
|  | 1.5 | + 0.6 (Vt = 1.0) | 0.95 | 88 pA |
|  | 1.5 | + 1.2 (Vt = 0.0) | 0.95 | 5 µA |

During (compaction: $V_{DS}$ = 4.9V, $V_{SUB}$ = 0V
Capacitive Coupling Ratio = .6

TABLE 3 shows a sequence of erase and compaction operations for five floating-gate memory cells 10 under similar conditions to those of TABLE 2. In TABLE 3, the floating-gate memory test cells 10 with ultraviolet threshold voltages $V_{TUV}$ of about 2 V are illustrated as having compaction voltages applied for times ranging from 100 to 1000 milliseconds. As column 3 in TABLE 3 shows, the ultraviolet threshold voltage $V_{TUV}$ does not change, even after 1000 milliseconds of compaction. This implies that the ultraviolet threshold voltage $V_{TUV}$ of the main population of cells does not change under these compaction conditions. The five floating-gate memory cells 10 of TABLE 3 are then erased and the erased threshold voltages $V_T$ given in column 5 range from 0.89 V to 1.32 V. Column 6 shows various compaction times for each cell and column 7 gives the threshold voltages $V_T$ resulting form those various compaction times.

TABLE 3

| | Measurements Sequence | | | | | |
|---|---|---|---|---|---|---|
| Cell | 1<br>$V_{TUV}$ | 2<br>Compaction<br>Time | 3<br>$V_T$ | 4<br>Erase<br>Time | 5<br>$V_T$ | 6<br>Compaction<br>Time | 7<br>$V_T$ |
| No. 1 | 1.91 | 1000 ms | 1.91 | 1 sec | .89 | 500 ms | 1.62 |
| No. 2 | 1.98 | 500 ms | 1.99 | 1 sec | 1.22 | 500 ms | 1.64 |
| No. 3 | 1.98 | 150 ms | 1.98 | 1 sec | 1.22 | 150 ms | 1.60 |
| | | | | | | 850 ms | 1.71 |
| No. 4 | 2.07 | 100 ms | 2.07 | 0.5 sec | 1.32 | 50 ms | 1.60 |
| No. 5 | 2.03 | 500 ms | 2.04 | 0.5 sec | 1.06 | 150 ms | 1.62 |

The experimental data herein describes certain bias conditions for drains 12 and other bias conditions for sources 11. In many cases, the general bias conditions for sources 11 and drains 12 are reversible, yet accomplish the same result. Therefore, the terms "source" and "drain" as used herein are interchangeable as used in this text, including the claims.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. An extended-life method for soft-programming at least one floating gate memory cell, said memory cell having a control gate, a source, a drain and a substrate, said cell hard-programmable with a hard-programmable voltage applied between said control gate and said substrate, said method comprising:
   determining a specific drain voltage by:
      connecting said source and said substrate to a reference voltage;
      applying to said control gate a soft-programming voltage, said soft-programming voltage being between thirty and sixty percent of said hard-programmable voltage; and
      applying to said drain a voltage increasing from said reference voltage while measuring the current flow into said drain;
   said specific drain voltage equal to or less than that value of said increasing voltage at which said current flow into said drain reaches a first peak; and
   soft-programming said cell by:
      applying to said drain a first voltage measured from the voltage at said substrate, said first voltage being less than the sum or about one volt plus a second voltage plus said specific drain voltage;
      applying to said source a non-negative said second voltage measured from the voltage at said substrate, said second voltage less than said specific drain voltage; and
      applying to said control gate a third voltage measured from said substrate, said third voltage no greater than said soft-programmable voltage.

2. The method of claim 1, wherein more than one cell is programmed simultaneously.

3. The method of claim 1, wherein all of said memory cells in said array are programmed at the same time by using said method.

4. The method of claim 1, said memory cell further including a channel in said substrate between said source and said drain, wherein the floating gate of said memory cell covers the entire said channel of said memory cell.

5. An extended-life method for soft-programming at least one floating gate memory cell, said memory cell having a control gate, a source, a drain and a substrate, said cell being hard-programmable with a hard-programmable voltage applied between said control gate and said substrate, said method comprising:
   applying to said drain a first voltage measured from the voltage at said substrate, said first voltage less that the sum of about one volt plus a second voltage plus a specific drain voltage;
   applying to said source a non-negative said second voltage measured from the voltage at said substrate, said second voltage less than said specific drain voltage; and
   applying to said control gate a third voltage measured from the voltage at said substrate, said third voltage no greater than a soft-programmable voltage;
   said soft-programming voltage being between thirty and sixty percent of said hard-programmable voltage;
   said specific drain voltage determined by connecting said source and said substrate to a reference voltage and applying to said control gate, said soft-programming voltage, then applying to said drain a voltage increasing from said reference voltage while measuring the current flow into said drain, said specific drain voltage equal to or less than that value of said increasing voltage at which said current flow into said drain reaches a first peak.

6. The method of claim 5, wherein more than one cell is programmed simultaneously.

7. The method of claim 5, wherein all of said memory cells in said array are programmed at the same time by using said method.

8. The method of claim 5, said memory cell further including a channel in said substrate between said source and said drain, wherein the floating gate of said memory cell covers the entire said channel of said memory cell.

9. The method of claim 5, wherein all of said memory cells in said array are programmed at the same time by using said method.

10. The method of claim 5, said memory cell further including a channel in said substrate between said source and said drain, wherein the floating gate of said memory cell covers the entire said channel of said memory cell.

11. An extended-life method for soft-programming at least one floating gate memory cell, said memory cull having a control gate, a source, a drain and a substrate, said being cell being hard-programmable with a hard-programmable voltage applied between said control gate and said substrate, said method comprising:

applying, to said drain a first voltage measured from the voltage at said substrate, said first voltage less than the sum of about one volt plus a second voltage plus a specific drain voltage;

said specific drain voltage determined by connecting said source and said substrate to a reference voltage and applying to said control gate a soft-programming voltage being between thirty and sixty percent of said hard-programmable voltage, then applying to said drain a voltage increasing from said reference voltage while measuring the current flow into said drain, said specific drain voltage equal to or less than that value of said increasing voltage at which said current flow into said drain reaches a first peak;

applying to said source a non-negative said second voltage measured from the voltage at said substrate, said second voltage less than said specific drain voltage; and applying to said control gate a third voltage measured from the voltage at said substrate said third voltage no greater than said soft-programmable voltage.

12. The method of claim 11, wherein more than one of said memory cells is programmed at the same time by using said method.

* * * * *